United States Patent [19]
Eckert

[11] 4,297,596
[45] Oct. 27, 1981

[54] SCHMITT TRIGGER

[75] Inventor: Kim Eckert, Austin, Tex.

[73] Assignee: Motorola, Inc., Schaumburg, Ill.

[21] Appl. No.: 35,050

[22] Filed: May 1, 1979

[51] Int. Cl.³ .................. H03K 3/295; H03K 3/356
[52] U.S. Cl. .................................... 307/279; 307/290
[58] Field of Search ............... 307/251, 279, 290, 304

[56] References Cited
U.S. PATENT DOCUMENTS

| | | | |
|---|---|---|---|
| 3,612,908 | 10/1971 | Heimbigner | 307/279 |
| 3,873,856 | 3/1975 | Gerlach et al. | 307/279 |
| 3,882,331 | 5/1975 | Sasaki | 307/290 X |
| 3,904,888 | 9/1975 | Griffin et al. | 307/279 X |
| 3,984,703 | 10/1976 | Jorgensen | 307/279 |
| 4,048,524 | 9/1977 | Laugesen et al. | 307/290 X |
| 4,063,119 | 12/1977 | Odell et al. | 307/290 X |
| 4,071,784 | 1/1978 | Maeder et al. | 307/290 X |
| 4,097,772 | 6/1978 | Carter | 307/279 |

*Primary Examiner*—Larry N. Anagnos
*Attorney, Agent, or Firm*—Anthony J. Sarli, Jr.; Vincent B. Ingrassia; Jeffrey Van Myers

[57] ABSTRACT

A compensated Schmitt trigger includes first and second balanced current paths between $V_{DD}$ and ground for establishing the Schmitt trigger's low and high output respectively. The first path includes a first small enhancement device, a second depletion device and a third enhancement device. The second path includes a fourth enchancement device and said second and third devices. Thus, each path includes two enhancement devices and one depletion device. Process variations in each path will tend to track stabilizing the difference between the low and high switching voltages.

2 Claims, 3 Drawing Figures

4,297,596

SCHMITT TRIGGER

BACKGROUND OF THE INVENTION

1. Field of the Invention

This invention relates generally to Schmitt triggers and, more particularly, to an MOS Schmitt trigger circuit exhibiting a constant difference between the positive and negative switching voltages.

2. Description of the Prior Art

The advantages offered by MOS technology are well known; e.g. higher density, greater yield, etc. Thus, smaller MOS device geometries permit a greater number of devices to be produced per unit area or, stated another way, a single MOS device will occupy less space. This characteristic is extremely important in the design and fabrication of complex digital integrated circuits; for example, single chip microprocessors.

Whereas digital circuitry is generally characterized by its "ON/OFF" or "ONE/ZERO" nature, most measurements in the real world are inherently analog; e.g., temperature, pressure, speed, voltage, etc. Therefore, it is necessary that microprocessors and other digital circuitry communicate or interface with analog circuitry such as amplifiers, buffers, comparators, etc., in order to permit digital processing of the analog signals. The required interfacing may be accomplished by providing analog components which are external to the microprocessor chip. However, such arrangements generally require more current, a larger power supply and commonly present more opportunities for design and manufacturing errors. To avoid these disadvantages, analog circuits are being manufactured integrally with the digital circuitry; e.g., on the microprocessor chip itself, and due to the complex nature of microprocessors, the inclusion of analog devices on the same chip requires that the same manufacturing process be employed.

Schmitt triggers are a commonly found interface between the analog and digital domains. To eliminate noise and spurious oscillations, the circuit is designed to have hysteresis between the upper and lower threshold values, which values are normally defined by two switching voltages $V_H$ and $V_L$.

A disadvantage suffered by the standard MOS circuit resides in the inability to maintain the switching voltages $V_H$ and $V_L$ constant due to processing variations. Furthermore, as a result of said processing variations, as for example between the threshold voltages of enhancement and depletion devices, the difference between $V_H$ and $V_L$ cannot be maintained constant when employing the standard circuit. Thus, the standard circuit could not be used to accurately control the frequency of, for example, a relaxation oscillator.

SUMMARY OF THE INVENTION

It is an object of the present invention to provide an improved MOS Schmitt trigger circuit.

It is a further object of the invention to provide a Schmitt trigger circuit wherein the difference between the upper and lower switching voltages remains substantially constant.

According to a broad aspect of the invention there is provided a MOS Schmitt trigger circuit exhibiting a substantially constant difference between a first switching voltage at which the trigger output goes high and a second switching voltage at which the trigger output goes low, comprising: a first path for conducting current when said output is low, said first path including first and second field effect transistors of a first type and a third field effect transistor of a second type; and a second path for conducting current when said output is high, said second path including said second and third field effect transistors and a fourth field effect transistor of said first type.

The above and other objects, features and advantages of the present invention will be more clearly understood from the following detailed description taken in conjunction with the accompanying drawings, in which:

DESCRIPTION OF THE PREFERRED EMBODIMENT

Figure 1:
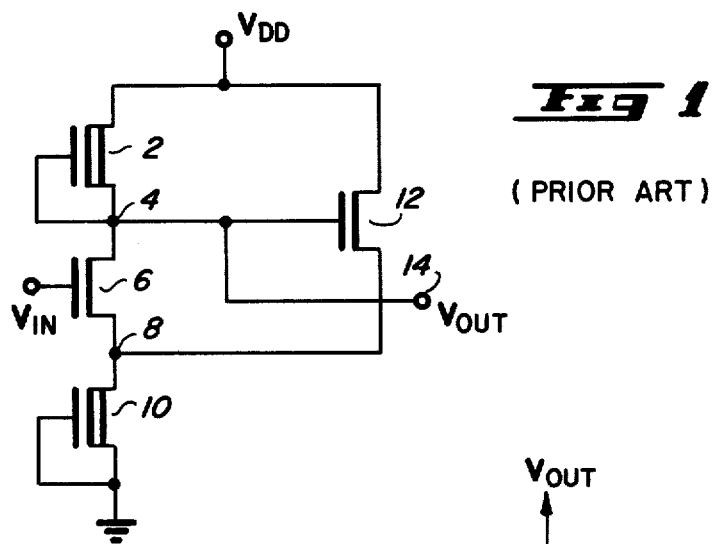
FIG. 1 is a schematic diagram of a MOS Schmitt trigger according to the prior art.

FIG. 1 is a schematic diagram of a MOS Schmitt trigger circuit comprising preferably NMOS field effect transistors 2, 6, 10 and 12. Devices 2 and 10 are depletion devices connected as resistors, transistor 2 being much smaller than transistor 10. Devices 6 and 12 are enhancement devices, transistor 12 being relatively large. The input voltage Vin is applied to the gate of transistor 6 and the output voltage Vout is taken from node 4 and appears at output terminal 14.

Figure 2:
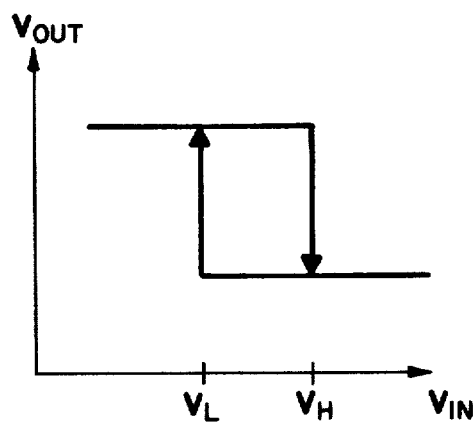
FIG. 2 illustrates, in graphical form, the hysteresis type switching action of Schmitt triggers.

Referring to FIGS. 1 and 2 in conjunction, when Vin is high, nodes 4 and 8 are effectively shorted and current flows from $V_{DD}$ through devices 2 and 10. Since device 2 is small, the voltage at node 4 (Vout) is low. Thus, the voltage at the source of device 6 (node 8) is likewise low. To turn device 6 off, Vin must be reduced to a voltage $V_L$ (FIG. 2) which is below its source voltage. At this point, device 6 turns off and the drive to the gate of enhancement device 12 is increased via depletion device 2 causing Vout to increase and turning device 12 on. Since enhancement device 12 is relatively large, a large amount of current is sourced by device 12 to node 8 causing the voltage at node 8 (the source of device 6) to increase. Thus, to turn device 6 back on, the input voltage must achieve a voltage $V_H$ (approximately one threshold voltage above the now higher source voltage). This hysteresis type switching action is illustrated in FIG. 2 wherein the output voltage (Vout) is plotted as a function of Vin. The transition from a high to a low output voltage occurs at $V_H$, and the transition from a low to a high output voltage occurs at $V_L$.

When the output of the circuit shown in FIG. 1 is low, the current which sets the trigger point $V_L$ flows from $V_{DD}$ to ground via two depletion devices 2 and 10 (enhancement device must be ignored since it is effectively shorted. Therefore, any processing variations affecting the operational characteristics (e.g. threshold voltage) of depletion devices will appear in both device 2 and device 10. Thus, $V_L$ will remain substantially unchanged. However, when Vout is high, current is flowing from $V_{DD}$ to ground via enhancement device 12 and depletion device 10. Any changes in threshold voltage or device 14 and/or device 10 will cause $V_H$ to wander. Thus, the difference between $V_H$ and $V_L$ will vary. As stated previously, this is an undesirable characteristic.

Figure 3:
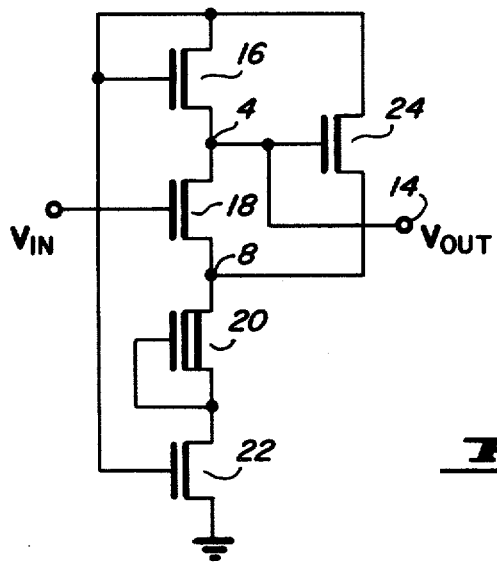
FIG. 3 is a schematic diagram of the inventive Schmitt trigger circuit.

The inventive Schmitt trigger circuit shown in FIG. 3 substantially solves this problem. The circuit comprises field effect transistors 16, 18, 20, 22 and 24 and functions in generally the same fashion as does the circuit in FIG. 1. The switching voltages are still governed by the voltages at nodes 4 and 8. The circuit differs in that depletion device 2 has been replaced by a small enhancement device 16 having a gate and drain coupled to $V_{DD}$, and depletion device 10 has been replaced by the combination of enhancement device 22 having a gate coupled to $V_{DD}$ and depletion device 20 connected as a resistor between enhancement devices 18 and 22.

When Vin is high, device 18 is in effect shorted and current flows from $V_{DD}$ to ground via enhancement device 16, depletion device 20 and enhancement device 22. The voltage at node 4 decreases resulting in a low output voltage. When Vin is reduced to $V_L$, enhancement device 24 is turned on causing current to flow from $V_{DD}$ to ground via enhancement device 24, depletion device 20 and enhancement device 22. The output voltage goes high, and the voltage at node 8 increases thus latching the output.

It should be noted that using this circuit configuration, when the output voltage is low, current flows through two enhancement devices and a depletion device. When the output voltage is high, current likewise flows through two enhancement devices and a depletion device. Processing variations in the depletion and/or enhancement devices will be manifested in both current paths and therefore, variations in $V_L$ ($V_H$) will tend to track $V_H$ ($V_L$) thus maintaining the difference between $V_L$ and $V_H$ substantially constant.

The foregoing description of the invention is given by way of example only. No attempt has been made to illustrate all possible embodiments of the invention. For example, the circuit might be implemented in NMOS, PMOS, CMOS, etc. These and other modifications may occur to one skilled in the art, and it is therefore intended that the invention include all such modifications and equivalents which fall within the scope of the appended claims.

I claim:

1. A MOS Schmitt trigger circuit comprising:
   a first field effect transistor of the enhancement type and having a drain and a gate coupled to a first potential, and a source coupled to an output terminal;
   a second field effect transistor of the enhancement type and having a drain coupled to the source of the first transistor, a gate coupled to an input terminal, and a source;
   a third field effect transistor of the depletion type and having a drain coupled to the source of the second transistor, a gate, and a source;
   a fourth field effect transistor of the enhancement type and having a drain coupled to the gate and source of the third transistor, a gate coupled to the first potential, and a source coupled to a second potential; and
   a fifth field effect transistor of the enhancement type and having a drain coupled to the first potential, a gate coupled to the drain of the second transistor, and a source coupled to the drain of the third transistor.

2. A circuit according to claim 1 wherein said first, second, third, fourth and fifth transistors are N-channel field effect transistors.

* * * * *